United States Patent
Gaudin

(10) Patent No.: US 9,330,958 B2
(45) Date of Patent: May 3, 2016

(54) PROCESS FOR FABRICATING A HETEROSTRUCTURE LIMITING THE FORMATION OF DEFECTS

(71) Applicant: Soitec, Crolles Cedex (FR)

(72) Inventor: Gweltaz Gaudin, Grenoble (FR)

(73) Assignee: SOITEC, Bernin (FR)

(*) Notice: Subject to any disclaimer, the term of this patent is extended or adjusted under 35 U.S.C. 154(b) by 0 days.

(21) Appl. No.: 14/360,124

(22) PCT Filed: Nov. 21, 2012

(86) PCT No.: PCT/IB2012/002482
§ 371 (c)(1),
(2) Date: May 22, 2014

(87) PCT Pub. No.: WO2013/080010
PCT Pub. Date: Jun. 6, 2013

(65) Prior Publication Data
US 2015/0132923 A1     May 14, 2015

(30) Foreign Application Priority Data

Nov. 30, 2011 (FR) ...................... 11 61000

(51) Int. Cl.
| H01L 21/30 | (2006.01) |
| H01L 21/762 | (2006.01) |
| H01L 21/02 | (2006.01) |
| H01L 21/265 | (2006.01) |
| H01L 21/306 | (2006.01) |
| H01L 21/324 | (2006.01) |

(52) U.S. Cl.
CPC ...... *H01L 21/76251* (2013.01); *H01L 21/0262* (2013.01); *H01L 21/02164* (2013.01); *H01L 21/02238* (2013.01); *H01L 21/02532* (2013.01); *H01L 21/02592* (2013.01); *H01L 21/02595* (2013.01); *H01L 21/02667* (2013.01); *H01L 21/26513* (2013.01); *H01L 21/30625* (2013.01); *H01L 21/324* (2013.01); *H01L 21/76254* (2013.01)

(58) Field of Classification Search
None
See application file for complete search history.

(56) References Cited

U.S. PATENT DOCUMENTS 7,268,060 B2 * 9/2007 Ghyselen et al. ............. 438/458
(Continued)

FOREIGN PATENT DOCUMENTS

| FR | 2810448 A1 | 12/2001 |
| JP | 2007318097 A | 12/2007 |

OTHER PUBLICATIONS

International Search Report for International Application No. PCT/IB2012/002482 dated Aril 22, 2013, 3 pages.
(Continued)

*Primary Examiner* — Kyoung Lee
(74) *Attorney, Agent, or Firm* — TraskBritt

(57) ABSTRACT

The invention relates to a process for fabricating a heterostructure comprising at least one thin layer and a carrier substrate made of a semiconductor, the process comprising: bonding a first substrate made of a single-crystal first material, the first substrate comprising a superficial layer made of a polycrystalline second material, to a second substrate so that a bonding interface is created between the polycrystalline layer and the second substrate; removing from the free surface of one of the substrates, called the donor substrate, a thickness thereof so that only a thin layer is preserved; generating a layer of amorphous semiconductor material between the first substrate and the bonding interface by amorphization of the layer of polycrystalline material; and crystallizing the layer of amorphous semiconductor material, the newly crystallized layer having the same orientation as the adjacent first substrate.

15 Claims, 1 Drawing Sheet

(56) References Cited

U.S. PATENT DOCUMENTS

| | | | |
|---|---|---|---|
| 7,387,947 B2 | 6/2008 | Cayrefourcq et al. | |
| 7,485,551 B2 | 2/2009 | Hebras | |
| 2005/0020031 A1* | 1/2005 | Letertre et al. | 438/455 |
| 2008/0153313 A1* | 6/2008 | Kononchuk | 438/795 |
| 2009/0321873 A1 | 12/2009 | Nguyen et al. | |

OTHER PUBLICATIONS

Vincent et al., A model of interface defect formation in silicon wafer bonding, Applied Physics Letters, vol. 94, 101914, (2009), 4 pages.

Vincent et al., Study of the formation, evolution, and dissolution of interfacial defects in silicon wafer bonding, Journal of Applied Physics, vol. 107, 093513 (2010), 7 pages.

* cited by examiner

PROCESS FOR FABRICATING A HETEROSTRUCTURE LIMITING THE FORMATION OF DEFECTS

CROSS-REFERENCE TO RELATED APPLICATIONS

This application is a national phase entry under 35 U.S.C. §371 of International Patent Application PCT/IB2012/002482, filed Nov. 21, 2012, designating the United States of America and published in English as International Patent Publication WO 2013/080010 A1 on Jun. 6, 2013, which claims the benefit under Article 8 of the Patent Cooperation Treaty and under 35 U.S.C. §119(e) to French Patent Application Serial No. 1161000, filed Nov. 30, 2011, the disclosure of each of which is hereby incorporated herein in its entirety by this reference.

TECHNICAL FIELD

Generally, the invention relates to the fabrication of heterostructures, i.e., structures obtained by joining elementary structures, especially used for microelectronic, optoelectronic, photovoltaic or micromechanical applications. The invention in particular relates to "semiconductor-on-insulator" structures, also called "SOI" structures.

In this text, the term "insulating" is understood to mean electrically insulating.

The invention is particularly applicable to the context of reducing the number of defects that appear during fabrication of such structures and that reduce their electronic performance.

BACKGROUND

An SOI structure generally comprises at least one intermediate insulating layer between a thin upper layer and a carrier substrate, typically made of silicon. The expression "thin layer" is understood to mean a layer that is typically between 50 Å and a few microns in thickness, for example, about 120 Å in thickness.

The insulating layer may be an oxide layer, such as a layer of $SiO_2$, which is then called a BOX for buried oxide, i.e., the oxide is buried under a thin silicon layer. The carrier substrate is sometimes made of another material, for example, of sapphire—SOS (silicon-on-sapphire) structures are then spoken of.

Indeed, certain heterostructures do not comprise an intermediate insulating layer, as is the case for DSB (direct silicon bonding) substrates in which a thin silicon layer having a first crystal orientation is joined to a second silicon substrate having a second crystal orientation that is different to the first.

The fabrication of SOI structures generally comprises the following steps:
- forming an insulating layer of a first substrate and/or a second substrate;
- bonding, preferably molecular bonding (a.k.a. direct bonding), the first substrate to the second substrate; and
- removing a back part of one of the two substrates so as to leave only a thin layer, also called the useful layer, on the insulating layer.

Fabrication processes furthermore comprise bond-strengthening and finishing steps for improving the surface finish of the thin layer thus obtained. The finishing steps may be, for example, polishing or annealing steps.

In the microelectronics field, the quality of the thin layer, and that of the bonding interface, are important. In particular, it is desirable to reduce the number of defects as far as possible in order to allow electronic components to be produced on or in these structures.

However, current processes for fabricating heterostructures may cause a number of different types of defects. Among these defects, blisters and voids are particularly problematic.

These defects are especially generated by the outgassing of species, most commonly hydrogen ($H_2$) or even helium (He) from layers of the structure, and accumulation of the outgassed species, in particular, at the bonding interface.

This outgassing may result from steps of implanting species such as hydrogen or helium ions, for example, in the context of implementation of the SMARTCUT® process.

It may also be generated during the bonding step or during steps of strengthening the bond between the two substrates. Specifically, during the strengthening anneal, water molecules react with the materials of the first and second substrate (possibly by diffusing through an optional superficial oxide layer) via an oxidation reaction, which may be written, in the case of silicon substrates, as:

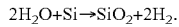

$$2H_2O + Si \rightarrow SiO_2 + 2H_2.$$

This reaction, therefore, produces molecules of hydrogen gas that are trapped in the buried oxide layer, when the latter is present, which thus acts as a reservoir of hydrogen gas.

However, in the case of an ultrathin oxide layer, or when this layer is absent altogether, it is not possible for all the hydrogen gas molecules generated to be stored, and the excess accumulates at the bonding interface and generates defects.

Specifically, as soon as the temperature to which the bonded structure is subjected to exceeds 300° C., the hydrogen gas begins to exert pressure on defects present at the bonding interface, causing blisters to form.

This effect is described in the following articles: "A model of interface defect formation in silicon wafer bonding," S. Vincent et al., Applied Physics Letters 94, 101914 (2009), and "Study of the formation, evolution, and dissolution of interfacial defects in silicon wafer bonding," S. Vincent et al., Journal of Applied Physics 107, 093513 (2010).

It would, therefore, be advantageous to be able to limit, as far as possible, the number of defects resulting from this outgassing effect.

The smaller the thickness of the BOX, to the point where there is no BOX, such as is the case for DSB heterostructures, for example, the more problematic this effect becomes. In particular, the latest generation of SOI structures, called UTBOX (ultra-thin buried oxide) structures, in which the insulating layer is smaller than about 50 nm in thickness, exhibits a high defect density because the insulating oxide layer is not thick enough to contain all the gas freed during the process.

To solve this problem, it has been suggested, in U.S. Pat. No. 7,485,551, to implant, in the oxide layer of the SOI structure, atoms that can trap the gaseous species liable to generate defects in the structure. This solution, nevertheless, has the drawback that the implanted atoms disrupt the SOI structure.

It is also known from U.S. Pat. No. 7,387,947, that attempts have been made to use an amorphous silicon layer to trap the gas.

Finally, from JP 2007318097, the use is known of a polysilicon layer, placed near the insulating layer so as to trap metal species liable to contaminate the oxide layer. This technique does not directly solve the problem of how to trap species generated during the fabrication process. Furthermore, with this technique, the polysilicon may recrystallize with a large grain size during the heat treatment, thus affecting the uniformity and the functionality of the substrate.

DISCLOSURE

The object of the invention is to provide a process for fabricating heterostructures, which process limits the formation of defects caused by species outgassing, particularly in the case of UTBOX structures.

The invention also aims to be compatible with various processes for forming heterostructures and, in particular, the SMARTCUT® process or the SMARTSTACKING™ process (in the latter, the thin layer is formed, after the direct bonding of the substrates, by mechanical and/or chemical thinning of one of the two substrates).

In order to achieve these aims, the invention provides a process for fabricating a hetero structure comprising at least one thin layer and a carrier substrate made of a semiconductor, the process comprising steps consisting in:

bonding a first substrate made of a single-crystal first material, the first substrate comprising a superficial layer made of a polycrystalline second material, to a second substrate so that a bonding interface is created between the polycrystalline layer and the second substrate;

removing from the free surface of one of the substrates, called, the donor substrate, a thickness thereof so that only a thin layer is preserved;

generating a layer of amorphous semiconductor material between the first substrate and the bonding interface by amorphization of the layer of polycrystalline material; and crystallizing the layer of amorphous semiconductor material, the newly crystallized layer having the same orientation as the adjacent first substrate.

Advantageously, but optionally, the process according to the invention may furthermore comprise at least one of the following features:

the bonding step comprises strengthening the bond using a stabilizing anneal that is liable to cause outgassing, the outgassing being absorbed by the layer made of the polycrystalline second material;

during the process the polycrystalline second layer is formed on the first substrate by plasma-enhanced chemical vapor deposition (PECVD) or low-pressure chemical vapor deposition (LPCVD);

the step of generating the amorphous layer comprises amorphization of part of the first substrate;

the amorphization is achieved by implanting silicon atoms at an energy of 50 keV and at a dose of $2 \times 10^{15}$ at/cm;

the step of crystallizing the amorphous layer is carried out by solid phase epitaxy from the first substrate;

the solid phase epitaxy is carried out by annealing at a temperature of at least 550° C. for at least one hour;

the constituent material of the first and second substrates and of the layer of polycrystalline material is silicon;

the process furthermore comprises a preliminary step of implanting species in the donor substrate, so as to form therein a weakened region, the step of removing a thickness of donor substrate consisting in detaching the thickness of donor substrate along the weakened region;

the step of removing the thickness of donor substrate is carried out by mechanical and/or chemical thinning;

the process furthermore comprises a step of finishing the thin layer, after the step of removing a thickness of donor substrate, consisting in treating the surface of the thin layer by way of a smoothing heat treatment, chemical-mechanical polishing (CMP) or sacrificial oxidation;

in the process, the donor substrate is the second substrate and the step of finishing the thin layer takes place between the removing step and the step of amorphization of the layer of polycrystalline material, or alternatively, the donor substrate is the first substrate, and the step of finishing the thin layer takes place after the crystallization step;

the process comprises a step, before the bonding step, of forming an insulating layer smaller than 50 nm in thickness on the surface of the second substrate, and in which, after the bonding, the insulating layer is located between the bonding interface and the second substrate. The insulating layer may then be made out of silicon oxide.

The invention also relates to a heterostructure, comprising at least one thin layer on a carrier substrate, obtained by the fabrication process according to the invention, this structure being blister free.

Advantageously, but optionally, the heterostructure according to the invention may furthermore comprise at least one of the following features:

it comprises a bonding interface between the thin layer and the carrier substrate, this substrate containing end-of-range defects located between 100 and 500 nm away from the bonding interface;

it furthermore comprises an insulating layer placed between the carrier substrate and the thin layer;

the insulating layer of the heterostructure is smaller than 50 nm in thickness;

the insulating layer is made of silicon oxide; and the carrier substrate and the thin layer are made of silicon.

BRIEF DESCRIPTION OF THE DRAWINGS

Other features, aims and advantages of the present invention will become apparent on reading the following detailed description, with regard to the appended figures, given by way of non-limiting example and in which.

DETAILED DESCRIPTION

FIGS. 1 and 2 illustrate two embodiments of the process for fabricating a heterostructure according to the invention.

FIG. 1 shows an embodiment implementing "direct bonding" and FIG. 2 shows an embodiment implementing "indirect bonding."

These two embodiments allow the number of blisters at the bonding interface to be reduced, or the number of non-transferred zones in the transferred thin layer.

Preparation of the Substrates

Figure 1A:
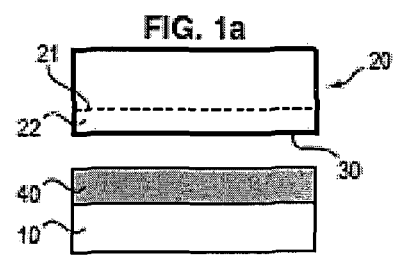
FIGS. 1a to 1e schematically show the steps of one embodiment of the process for fabricating a heterostructure according to the invention using "standard" or "direct" bonding.
Figure 2A:
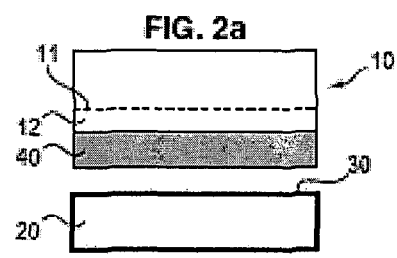
FIGS. 2a to 2f schematically show the steps of another embodiment of the process for fabricating a heterostructure according to the invention, using "indirect" bonding.

In FIGS. 1a and 2a, a first substrate 10 is used. This substrate is preferably made of a single-crystal semiconductor, for example, single-crystal silicon. Nevertheless, other materials may be envisaged, such as, for example, germanium, SiGe, GaAs or sapphire.

Throughout the rest of the description, the non-limiting example of a single-crystal silicon first substrate 10 will be taken.

Furthermore, a second crystalline substrate 20 is used, for example, made of silicon. Nevertheless, other materials may be envisaged, such as germanium, SiGe, or GaAs, the semiconductor material possibly being a bulk material or a multilayer.

The substrates 20 and/or 10 may furthermore comprise finished or unfinished components or additional layers.

Throughout the rest of the description, the non-limiting example of a silicon second substrate 20 will be taken.

Optionally, an insulating layer 30 is produced on the first substrate 10 and/or on the second substrate 20 (in the figures, the insulating layer 30 is produced on the second substrate 20). This insulator is preferably silicon dioxide $SiO_2$, but it may also be another insulator, for example $Si_3N_4$.

This insulating layer 30 may be about a few tens to a few hundred nanometers in thickness. In the case of UTBOX structures, it is smaller than 50 nm in thickness and typically equal to 10 nm in thickness.

It is produced, in a way known per se, by thermal oxidation of the first substrate 10 and/or the second substrate 20, when they are made of silicon, or by deposition, for example, chemical vapor deposition (CVD).

Furthermore, before the insulating layer 30 is optionally formed, a layer of polycrystalline material 40 is deposited on the first substrate 10. This layer is preferably made of the same material as the substrate on which it is deposited, but it may be envisaged to make this layer out of a material of a different nature. Throughout the rest of the description, the example of a polysilicon layer 40 will be taken.

This layer may be deposited by plasma-enhanced chemical vapor deposition (PECVD) or by low-pressure chemical vapor deposition (LPCVD).

The polysilicon layer 40 obtained at the end of this step typically is between 100 and 400 nm in thickness. The purpose of this layer is to trap, at grain boundaries and on dangling bonds, the species generated during certain steps of the process, and especially during the bonding step.

Furthermore, to finally obtain a heterostructure comprising a thin layer on a carrier substrate, one of the substrates 10, 20 is used as a donor substrate from which a thin layer is taken, and the other as a receiver substrate to which the thin layer is transferred.

The thin layer 12, 22 may be obtained by polishing, etching or grinding the donor substrate as will be described below, or by the SMARTCUT® transfer process. In this latter case, during the step of preparing the substrates shown in FIGS. 1a and 2a, a weakened region 11, 21 is generated in the donor substrate 10, 20.

This makes it possible to define the thickness of the thin layer 12, 22 to be transferred, and to subsequently split the substrate 10, 20 so as to separate the thin layer 12, 22 from the rest of the substrate 10, 20.

The weakened region 11, 21 is, for example, produced by incorporating species into the donor substrate 10, 20.

This incorporation may be carried out by implanting hydrogen or helium ionic species, at a total dose of between $2 \times 10^{16}$ and $7 \times 10^{16}$ at/cm². The implantation step makes it possible to split the donor substrate along this weakened region and detach the thin layer 12 from the rest of the substrate.

The implantation dose typically lies between $2 \times 10^{16}$ and $7 \times 10^{16}$ atoms per square centimeter.

In the case shown in FIG. 1a, the donor substrate is the second substrate 20 and, therefore, the weakened region 21 is produced in this second substrate 20. It defines the thin layer 22.

In contrast, in FIG. 2a, the weakened region 11 is produced in the first substrate 10, which is then the donor substrate, the weakened region defining the thin layer 12. In this case, the thin layer 12, still as yet attached to the donor substrate 10, is buried under and located adjacent to the polysilicon layer 40.

Bonding of the Substrates

Figure 1B:
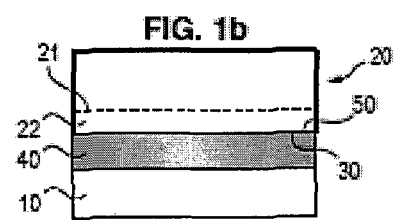
Figure 2B:
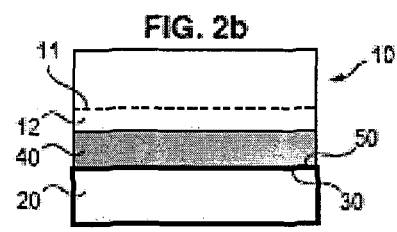

Next, as illustrated in FIGS. 1b and 2b, the first substrate 10 and the second substrate 20 are bonded so as to obtain a heterostructure 1 in which the oxide layer 30 and the polysilicon layer 40 are adjacent and near a bonding interface 50 (i.e., they may, in particular, be located on either side of the interface, as in the figures), and intermediate between the two substrates 10 and 20.

In particular, in the case where an insulating layer (for example, silicon oxide) has been formed only on the second substrate 20, the polysilicon layer 40 is placed between the bonding interface 50, where the outgassed species are liable to be generated, and the first substrate 10. Specifically, the polysilicon layer 40 is preferably adjacent to the bonding interface 50, so as to be able to absorb the species outgassed therefrom.

The bonding is achieved in a way known to those skilled in the art, for example, by direct bonding the two substrates 10 and 20.

Furthermore, the bonding step may be followed by a step used to partially strengthen the bond, for example, by carrying out a stabilizing anneal at a temperature between 500° C. and 800° C., for example, about 800° C., for about two hours. In the case where the SMARTCUT® technique is used to transfer the layer, the stabilizing and weakening anneal is typically carried out at between 200° C. and 500° C. for a few hours. This anneal may cause hydrogen outgassing via an oxidation reaction, for example, in the case of silicon via the reaction $2H_2O + Si \rightarrow SiO_2 + 4H$.

The layer 40 of polycrystalline material adjacent to the bonding interface 50 absorbs the outgassing and prevents the defects (for example, blisters) mentioned above from appearing at this stage.

At this stage, as illustrated in FIGS. 1b and 2b, a heterostructure is obtained comprising, in succession:

the first substrate 10;
the polysilicon layer 40, which is between 100 and 400 nm in thickness, for example, 240 nm in thickness;
the bonding interface 50;
an optional oxide layer 30, which may be smaller than 50 nm in thickness, for example, 80 Å in thickness; and
the second substrate 20.

Figure 1C:
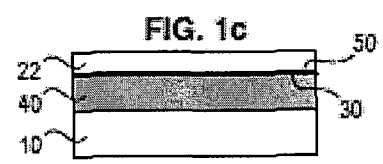
Figure 2C:
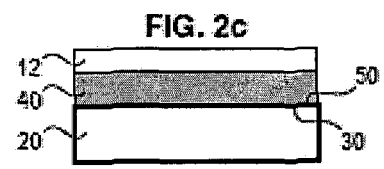

After the bonding step, with reference to FIGS. 1c and 2c, the thin layer is transferred from the donor substrate to the receiver substrate.

To do this, a thickness of donor substrate is removed from the free side of the back part of the substrate (i.e., from the side opposite that to which the receiver substrate is bonded), so that only the thickness of the thin layer remains. Typically, this thin layer is between 50 and several thousand ångströms in thickness.

There are a number of possible embodiments.

If the donor substrate 10 or 20 contains a weakened region 11 or 21 produced during the phase for preparing the substrates, a weakening anneal that splits the implanted substrate in the weakened region 11, 21 is carried out, according to the SMARTCUT® method.

Alternatively, the back part of the donor substrate may be removed by chemical and/or mechanical thinning (grinding, polishing).

In the direct bonding example in FIG. 1c, the second substrate 20 has been thinned so as to obtain the thin layer 22. The first substrate 10, therefore, forms the carrier substrate of the heterostructure.

In contrast, in FIG. 2c, corresponding to indirect bonding, the first substrate 10 is thinned so as to obtain a thin layer 12, and the substrate 20 forms the carrier substrate of the heterostructure.

After these first steps, a heterostructure is obtained comprising, in succession, in the case of direct bonding as shown in FIG. 1c:

the receiver first substrate 10;
the polysilicon layer 40, which is between 100 and 400 nm in thickness, for example, 240 nm in thickness;
the bonding interface 50;
the optional oxide or buried insulator layer 30, which may be smaller than 50 nm in thickness, for example, 80 Å in thickness; and
the transferred layer 22, which is between 50 Å and a few microns in thickness, for example, 120 Å in thickness.

In the case of indirect bonding, shown in FIG. 2c, a structure is obtained comprising, in succession:

the receiver second substrate 20;
the optional oxide or buried insulator layer 30, which may be smaller than 50 nm in thickness, for example, 80 Å in thickness;
the bonding interface 50;
the polysilicon layer 40, which is between 100 and 400 nm in thickness, for example, 240 nm in thickness; and
the transferred layer 12, which is between 50 Å and a few microns in thickness, for example, 120 Å in thickness.

The structure obtained, and particularly the bonding interface, must then be stabilized at a temperature of between 500° C. and 800° C.

Whether the bonding is direct or indirect, the consolidating anneal and/or any optional anneals carried out during the thinning and finishing steps, also cause gaseous species to diffuse out of the polycrystalline layer (for example, hydrogen formed during the bonding step and trapped in this polycrystalline layer).

Preferably, the temperature used in these steps is limited to 800° C. in order not to degrade the properties of the polycrystalline layer, for example, in order not to modify the microstructure of the polycrystalline layer.

By way of example, increasing the temperature above 800° C. could change the grain size, which could adversely affect the integrity of the thin buried oxide.

Generating an Amorphous Layer

After the heterostructure has been fabricated, which fabrication may possibly, if required, comprise additional steps such as a step of strengthening the bond between the substrates using a heat treatment, a step is carried out that consists in converting the polysilicon layer 40 into a layer 41 of amorphous material.

Figure 1D:
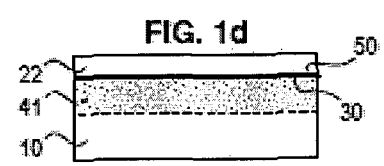
Figure 2D:
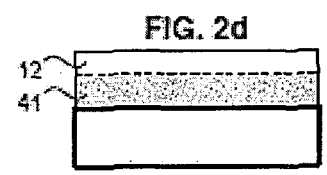

The step of generating the amorphous layer 41 is shown in FIGS. 1d and 2d.

To do this, the polysilicon layer 40 is amorphized right through its thickness. A superficial part of the first substrate 10 or of the thin layer 12 adjacent to the polysilicon layer 40 may also be amorphized, this superficial part being, for example, 100 nm in thickness. The amorphous region may, therefore, be between 100 and 500 nm in thickness.

The amorphization may be achieved by implanting high-energy atomic or ionic species through the superficial layers into the polysilicon layer 40.

The implantation depth of the atomic species and, therefore, the depth of the amorphous layer 41, depend on the nature of the implanted species, on the energy given to the species, and on the implantation dose.

Preferably, if the layer to be amorphized is silicon, the species chosen for the implantation is silicon, in order to preserve the homogeneity of the layer. Nevertheless, it may also be a heavy species such as xenon or germanium.

It is also possible to choose only to implant a dopant species (for example, implantation of boron, arsenic, or phosphorus) or a dopant species in combination with a heavy species (for example, $BF_2$).

The doping may allow a ground plane or a back gate to be formed.

Furthermore, the depth at which the species is implanted is set by virtue of the energy given to the species: the more energy given to the species to be implanted, the deeper the latter is implanted. Finally, the species implantation dose is chosen depending on the nature of the layer to be amorphized.

Moreover, in the case of the direct bonding shown in FIG. 1, an intermediate step of finishing and thinning the thin layer, for example, a smoothing heat treatment, or chemical-mechanical polishing (CMP), or even sacrificial oxidation, anneal, is preferably carried out between the step of transferring the thin layer and the amorphization step.

This makes it possible to minimize the energy required for the amorphizing implantation: since the thickness through which the implantation species has to pass is smaller, less energy is required.

To summarize, in the case of direct bonding, the steps of the process are preferably carried out in the following order:

bonding, consolidating anneal, and forming the thin layer (SMARTCUT®, SMARTSTACKING®);
thinning and finishing of the thin layer (sacrificial oxidation, polishing, etching, anneal, etc.); and
amorphization.

Moreover, the preliminary thinning used in the direct-bonding case allows approximately the same parameters to be used in the amorphization as in the indirect-bonding case.

Specifically, in the first case, the implantation is carried out through the thinned thin layer and the oxide layer; whereas, in the second case, it is carried out through the thin layer alone.

By way of example, for the layer thicknesses described above, silicon atoms are implanted at an energy of about 50 keV and at a dose of $2\times10^{15}$ atoms/cm$^2$.

Crystallization of the Amorphous Layer

Figure 1E:
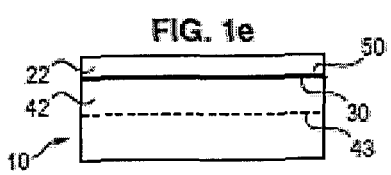
Figure 2E:
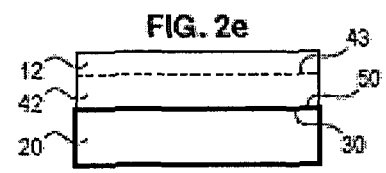

Once the amorphous layer 41 has been generated, it is crystallized, as illustrated in FIGS. 1e and 2e, so as to obtain a single-crystal silicon layer 42.

In this step, a single-crystal semiconductor having the same nature as the constituent material of the first substrate 10 is grown.

For example, a silicon crystal 42 is grown from the surface of the first substrate 10 adjacent to the amorphous layer 41 by solid phase epitaxy (SPE), the crystal 42 having the same crystal orientation as the first substrate 10. In the following, both the silicon layer 42 and the first substrate 10 are considered together to be just the first substrate 10.

The thermal budget of the epitaxy, i.e., the combined temperature/anneal time, is set so as to ensure that all of the amorphous layer 41 is crystallized, starting from the crystal/amorphous interface.

For example, for an amorphous layer 41 that is 240 nm in thickness, solid phase epitaxy is achieved by annealing at 550° C. for between one and two hours. The length of the annealing is decreased for higher temperatures.

More generally, the time and temperature parameters depend on the activation energy of the crystallization, which is described by an Arrhenius law. The activation energy was determined experimentally and may be affected by various parameters such as any doping of the layer or the amount of hydrogen that it contains.

After the step of crystallizing the amorphous layer, dislocation loops, known per se by those skilled in the art, and also called end-of-range or "EOR," defects 43 may appear at the original interface between the amorphous layer 41 and the first substrate 10, or the remainder thereof in the case where the first substrate is the donor substrate, after the step of transferring the thin layer, i.e., the thin layer 12 itself.

However, the process according to the invention makes it easy to counteract these defects or their drawbacks.

Specifically, in the direct bonding configuration (FIG. 1) in which the substrate 10 forms the carrier substrate of the hetero structure, the amorphization and crystallization parameters may be chosen so that the original interface between the amorphous layer 41 and the first substrate 10 is located a substantial distance away from the insulating layer 30 and the bonding interface 50, this distance, for example, being between 100 nm and 500 nm. This makes it possible to position the EOR defects 43 a distance away from the insulating layer 30 so as to prevent these defects from interfering with the layer, especially interfering electrically with the operation of devices formed in or on the thin layer 12.

Figure 2F:
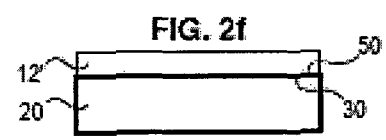

In the indirect bonding configuration (FIG. 2) where the substrate 10 has been thinned to provide the thin layer 12, this thin-layer part may be thinned in order to remove the defects in a step illustrated in FIG. 2f.

Thus, and in contrast to the direct bonding process, it is preferable to carry out a step of thinning the thin layer after the epitaxial crystallization step. Furthermore, this makes it possible to preserve, before the crystallization step, a thin single-crystal layer that is sufficiently thick to act as a template for the solid phase epitaxy.

Finally, conventional finishing steps, such as high-temperature annealing, polishing, etc., may be carried out on the final structure.

A heterostructure is obtained in which an optional insulating layer 30, typically an oxide such as $SiO_2$, is sandwiched between a thin layer 12, 22 and a carrier substrate 10, 20 made of single-crystal silicon.

This structure has the advantage of being completely free of blister-type defects.

The invention claimed is:

1. A method for fabricating a heterostructure comprising at least one thin layer and a carrier substrate comprising a semiconductor material, the method comprising:
   bonding a first substrate comprising a single-crystal first material and a superficial layer comprising a polycrystalline second material to a second substrate such that a bonding interface is created between the polycrystalline second material and the second substrate;
   removing from a free surface of one of the first substrate and the second substrate a thickness thereof such that only a thin layer of the one of the first substrate and the second substrate is preserved;
   generating a layer of amorphous semiconductor material between the single-crystal first material of the first substrate and the bonding interface by amorphization of the polycrystalline second material; and
   crystallizing the layer of amorphous semiconductor material to form a newly crystallized layer having an orientation the same as an orientation of the adjacent single-crystal first material.

2. The method of claim 1, wherein bonding the first substrate to the second substrate comprises strengthening the bond using a stabilizing anneal causing outgassing of elements, the outgassed elements being absorbed by the polycrystalline second material.

3. The method of claim 1, further comprising forming the polycrystalline second layer on the first substrate by plasma enhanced chemical vapor deposition (PECVD) or low-pressure chemical vapor deposition (LPCVD).

4. The method of claim 1, wherein generating the layer of amorphous semiconductor material comprises amorphization of part of the first substrate.

5. The method of claim 1, wherein generating the layer of amorphous semiconductor material comprises implanting silicon atoms into the polycrystalline second material at an energy of 50 keV and at a dose of $2 \times 10^{15}$ at/cm.

6. The method of claim 1, wherein crystallizing the layer of amorphous semiconductor material comprises solid phase epitaxy from the single-crystal first material of the first substrate.

7. The method of claim 6, wherein the solid phase epitaxy is carried out by annealing at a temperature of at least 550° C. for at least one hour.

8. The method of claim 1, wherein each of the single-crystal first material of the first substrate, the polycrystalline second material of the first substrate, and the second substrate comprises silicon.

9. The method of claim 1, further comprising implanting ionic species into the one of the first substrate and the second substrate and forming therein a weakened region, and wherein removing from the free surface of the one of the first substrate and the second substrate the thickness thereof comprises detaching the thickness along the weakened region.

10. The method of claim 1, wherein removing from the free surface of the one of the first substrate and the second substrate the thickness thereof comprises mechanical and/or chemical thinning of the one of the first substrate and the second substrate.

11. The method of claim 1, further comprising treating a surface of the thin layer by at least one of a smoothing heat treatment, a chemical-mechanical polishing (CMP) process, and a sacrificial oxidation process after removing from the free surface of the one of the first substrate and the second substrate the thickness thereof.

12. The method of claim 11, wherein removing from the free surface of the one of the first substrate and the second substrate the thickness thereof comprises removing from the free surface of the second substrate the thickness thereof, and wherein treating the surface of the thin layer is carried out after removing from the free surface of the second substrate the thickness thereof and prior to generating the layer of amorphous semiconductor material.

13. The method of claim 11, wherein removing from the free surface of the one of the first substrate and the second substrate the thickness thereof comprises removing from the free surface of the first substrate the thickness thereof, and wherein treating the surface of the thin layer is carried out after generating the layer of amorphous semiconductor material.

14. The method of claim 1, further comprising foiling an insulating layer having a thickness of 50 nm or less on the surface of the second substrate prior to bonding the first substrate to the second substrate, and wherein the insulating layer is located between the bonding interface and the second substrate after bonding the first substrate to the second substrate.

15. The method of claim 14, wherein the insulating layer comprises silicon oxide.

* * * * *